United States Patent
Tung-Yu

(10) Patent No.: US 11,606,875 B1
(45) Date of Patent: Mar. 14, 2023

(54) LEVER EXTENSION MECHANISM ON A COMPUTING DEVICE COMPONENT

(71) Applicant: Dell Products L.P., Round Rock, TX (US)

(72) Inventor: Chien Tung-Yu, Taiwan (CN)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/508,449

(22) Filed: Oct. 22, 2021

(51) Int. Cl.
*H05K 7/14* (2006.01)
*H05K 5/02* (2006.01)

(52) U.S. Cl.
CPC ......... *H05K 7/1409* (2013.01); *H05K 5/0221* (2013.01); *H05K 7/1408* (2013.01)

(58) Field of Classification Search
CPC ....................................................... H05K 7/00
See application file for complete search history.

(56) References Cited

U.S. PATENT DOCUMENTS 10,517,183 B1 * 12/2019 Huang ................. H05K 7/1487
2021/0151361 A1 * 5/2021 Schlack ............... G01R 1/0458

* cited by examiner

*Primary Examiner* — Jerry Wu
(74) *Attorney, Agent, or Firm* — Chamberlain, Hrdlicka, White, Williams & Aughtry

(57) ABSTRACT

Embodiments described herein relate to a system for securing a computing device component. The system may include the computing device component that includes: a base component comprising a pass through hole, a rotating member coupled to the base component and adapted to rotate about an axis, a lever body that includes: a base-holding portion adapted to be positioned around the base component, and a lever extension at a first end of the lever body and extending substantially orthogonally in a direction substantially orthogonal to the axis, a lever locking component coupled to the lever body and that includes: a locking actuator, and an inserting component adapted to insert into the pass-through hole when the locking actuator is in a locked position, wherein when a force is applied to the lever extension, the base component rotates about the axis.

11 Claims, 12 Drawing Sheets

LEVER EXTENSION MECHANISM ON A COMPUTING DEVICE COMPONENT

BACKGROUND

Computing device components may be installed to a computing device. The computing device component may be securely installed to the computing device using fastening components. The application of the fastening component may not be performed easily for a usual user based on the location of, for example, GPUs in the computing device components.

SUMMARY

In general, in one aspect, embodiments described herein relate to a system for securing a computing device component. The system includes the computing device component that includes: a base component comprising a pass through hole, a rotating member coupled to the base component and adapted to rotate about an axis, a lever body that includes: a base-holding portion adapted to be positioned around the base component, and a lever extension at a first end of the lever body and extending substantially orthogonally in a direction substantially orthogonal to the axis, a lever locking component coupled to the lever body and that includes: a locking actuator, and an inserting component adapted to insert into the pass-through hole when the locking actuator is in a locked position, wherein when a force is applied to the lever extension, the base component rotates about the axis.

In general, in one aspect, embodiments described herein relate to a system for securing a computing device component. The system includes the computing device component that includes: a base component that includes a pass through hole, a rotating member coupled to the base component and adapted to rotate about an axis, a lever body that includes: a base-holding portion adapted to be positioned around the base component, a lever extension portion at a first end of the lever body and extending substantially orthogonally in a direction substantially orthogonal to the axis, a second lever extension portion at a second end of the lever body and extending substantially orthogonal to the axis, and a third lever extension portion connecting the first lever extension portion and the second extension portion, a lever locking component coupled to the lever body and that includes: a locking actuator, and an inserting component adapted to insert into the pass-through hole when the locking actuator is in a locked position, wherein when a force is applied to the lever extension, the base component rotates about the axis.

Other aspects of the embodiments disclosed herein will be apparent from the following description and the appended claims.

DETAILED DESCRIPTION

Figure 1A:
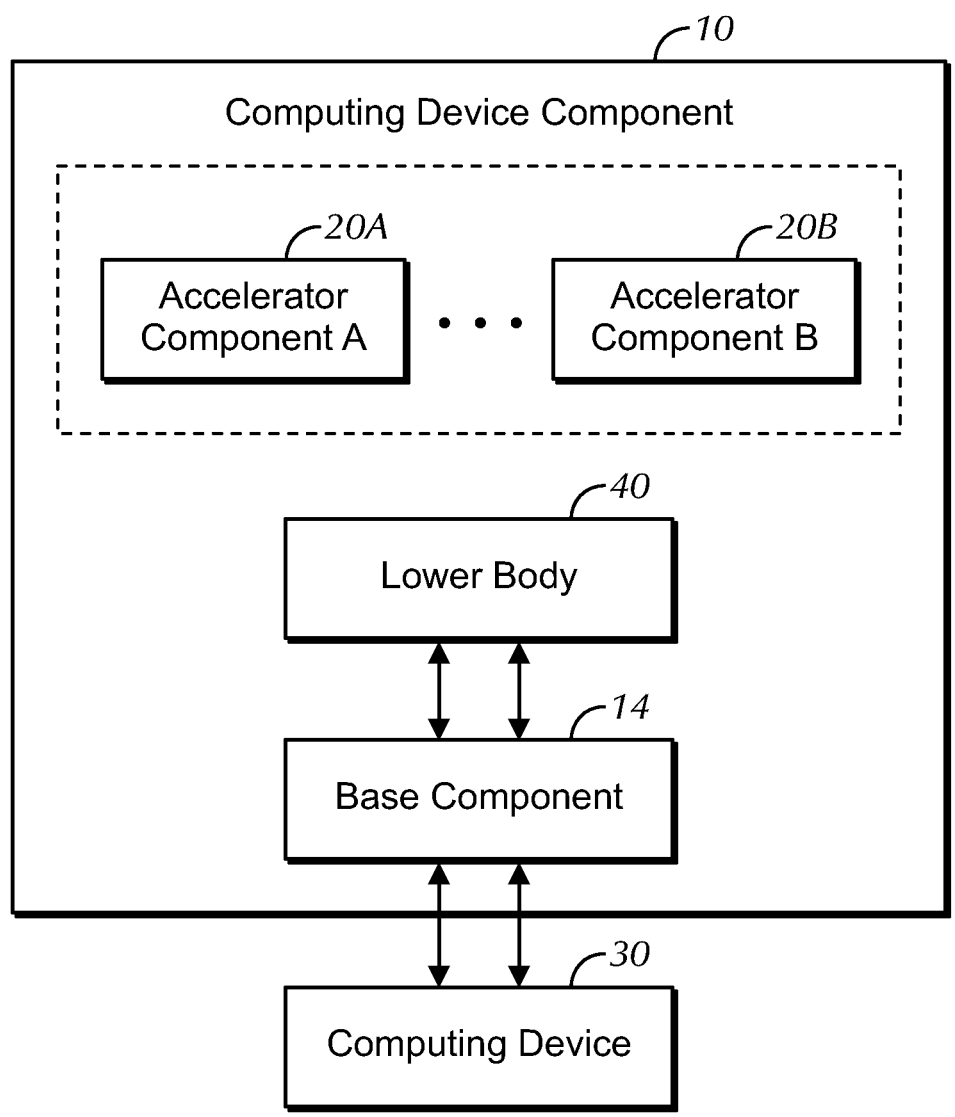
FIG. 1A shows a diagram of a system in accordance with one or more embodiments described herein.

Specific embodiments will now be described with reference to the accompanying figures. In the following description, numerous details are set forth as examples. It will be understood by those skilled in the art, and having the benefit of this Detailed Description, that one or more embodiments described herein may be practiced without these specific details and that numerous variations or modifications may be possible without departing from the scope of the embodiments. Certain details known to those of ordinary skill in the art may be omitted to avoid obscuring the description.

In the following description of the figures, any component described with regard to a figure, in various embodiments, may be equivalent to one or more like-named components shown and/or described with regard to any other figure. For brevity, descriptions of these components may not be repeated with regard to each figure. Thus, each and every embodiment of the components of each figure is incorporated by reference and assumed to be optionally present within every other figure having one or more like-named components. Additionally, in accordance with various embodiments described herein, any description of the components of a figure is to be interpreted as an optional embodiment, which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct (e.g., wired directly between two devices or components) or indirect (e.g., wired and/or wireless connections between any number of devices or components connecting the operatively connected devices) connection. Thus, any path through which information may travel may be considered an operative connection.

Additionally, directional words (e.g., top, bottom, above, below, right, left, x-direction, y-direction, etc.) may be used as an adjective to a noun or as a relative location of an element or component. The use of directional words is not meant to imply any required orientation within any two dimensional plane or three dimensional space. For example, the use of the words "top" and "bottom" are meant to convey relative positions (e.g., as shown in a figure), rather than any fixed position. The use of such words may instead convey a spatial relationship between a component and some other component.

In general, embodiments described herein relate to a mechanism for operating a component designed to securely install a computing device component to a computing device. In a computing device component, an electrical installation may be performed to operatively connect the computing device component to a computing device. To secure the installation and to reduce undesired or otherwise unexpected de-installation, the computing device component may include a mechanism for applying a fastening component to the computing device, where tension is applied to the fastening component that reduces the possibility of undesired separation between the computing device component and the computing device. The fastening component may be applied to (or removed from) the computing device using a base component attached to a rotating member. The rotating member may be rotated about an axis to reduce the tension and enable the application (or removal) of the fastening device. The rotation of the rotating member may be performed by applying a force on the base component. Traditionally, the force may be applied by a human hand (or a finger of the human hand) onto the base component.

The computing device component may include any number of accelerator components. The accelerator components may be implemented as graphics processing units (GPUs). As the operation of the GPUs require more processing power, the GPUs may require heat sinks that reduce the heat applied to the GPUs, thus extending the operability of the GPUs. The heat sinks used on the GPUs may be in a significant proximity to the base component such that unexpected difficulty in applying the force to the base component by a human hand is introduced.

To remediate the unexpected difficulty, embodiments of the invention relate to a lever body that attaches to the base component and provides an easier ability to rotate the rotating member. The lever body may include a lever extension that extends perpendicular, or at least substantially orthogonal, to the axis of rotation. As used herein, substantially orthogonal may refer to a direction that is within a range that is similar 90 degrees of a second reference direction. The range may include, for example, 70 degrees to 110 degrees. Other ranges may be used without departing from the invention. Further, the lever extension may extend such that a human hand may find it easier to apply a force that results in rotation of the rotating member. The ease of application of force may improve the mobility of the base component, thus improving the process of securely installing, or securely un-installing, the computing device component from the computing device.

FIG. 1A shows a diagram of a system in accordance with one or more embodiments described herein. As shown in FIG. 1A, the system includes a computing device component (10) that includes any number of accelerator components (20A, 20B), and a base component (14). The computing device component (10) may include additional, fewer, and/or different components.

In one or more embodiments of the invention, the accelerator components (20A, 20B) are components that include electrical operability that may be used by a computing device (30). For example, the accelerator components (20A, 20B) may provide specialized processing. The accelerator components may be implemented as, for example, graphics processing units (GPUs) attached to any number of heat sink units.

The accelerator components (20A, 20B) may be operatively connected to each other using, for example, a circuit board. In one or more embodiments, a circuit board is any structure that is configured to provide electrical connections between and/or within components (e.g., circuit components, integrated circuitry packages, etc.) that are attached in any way to the circuit board. In one or more embodiments, a circuit board may also provide mechanical support for any such components (e.g., within a computing device, network device, etc.). A non-limiting example of a circuit board is referred to as a printed circuit board (PCB).

As an example, the circuit board may be a PCB. In one or more embodiments, a PCB is a circuit board that includes a number of layers attached to one another. At least some of the layers may be conductive layers, which may be constructed from any conductive material, and which may be separated from one another by any number of non-conductive layers (e.g., a substrate) of any non-conductive material. One non-limiting example of a conductive material within a conductive layer is copper. One non-limiting example of a non-conductive material in a non-conductive layer is fiber glass. Other types of conductive and/or non-conductive materials may be included in circuit board layers without departing from the scope of embodiments described herein.

In one or more embodiments, the computing device (30) is any device or any set of devices that includes circuitry. Specifically, as used herein, a computing device is any device or set of devices that includes any integrated circuitry packages attached in any way to any one or more circuit boards. As an example, a computing device may be any device capable of electronically processing instructions and that includes, at least, one or more processors (e.g., integrated circuitry), any amount of volatile or non-volatile memory or storage, and/or any number of input and output device(s).

Examples of computing devices include, but are not limited to, a server (e.g., a blade-server in a blade-server chassis, a rack server in a rack, etc.), a desktop computer, a mobile device (e.g., laptop computer, smart phone, personal digital assistant, tablet computer, and/or any other mobile computing device), a network device (e.g., a multilayer switch, a router, a bridge, etc.), a storage device, a media device (e.g., televisions), and/or any other type of computing device.

In one or more embodiments of the invention, the computing device component (10) may be securely attached (also referred to as securely installed) to the computing device (30) using a base component (14) of the computing device component (10). An installation mechanism may be applied to the computing device (30) using the base component (14). The installation mechanism may include, for example, fastening components (not shown in FIG. 1A) that are applied to the computing device. The application (or detachment) of the fastening components may be performed by moving the base component (14).

To aid in the motion of the base component, a lever body (40) may be attached to the base component (14). While illustrated in FIG. 1A as a component of the computing device component (10), the lever body (40) may be detached from the base component (14) such that the lever body may not be considered a component of the computing device component (10). For additional details regarding the lever body (40), see, e.g., FIG. 6A-6B.

Figure 1B:
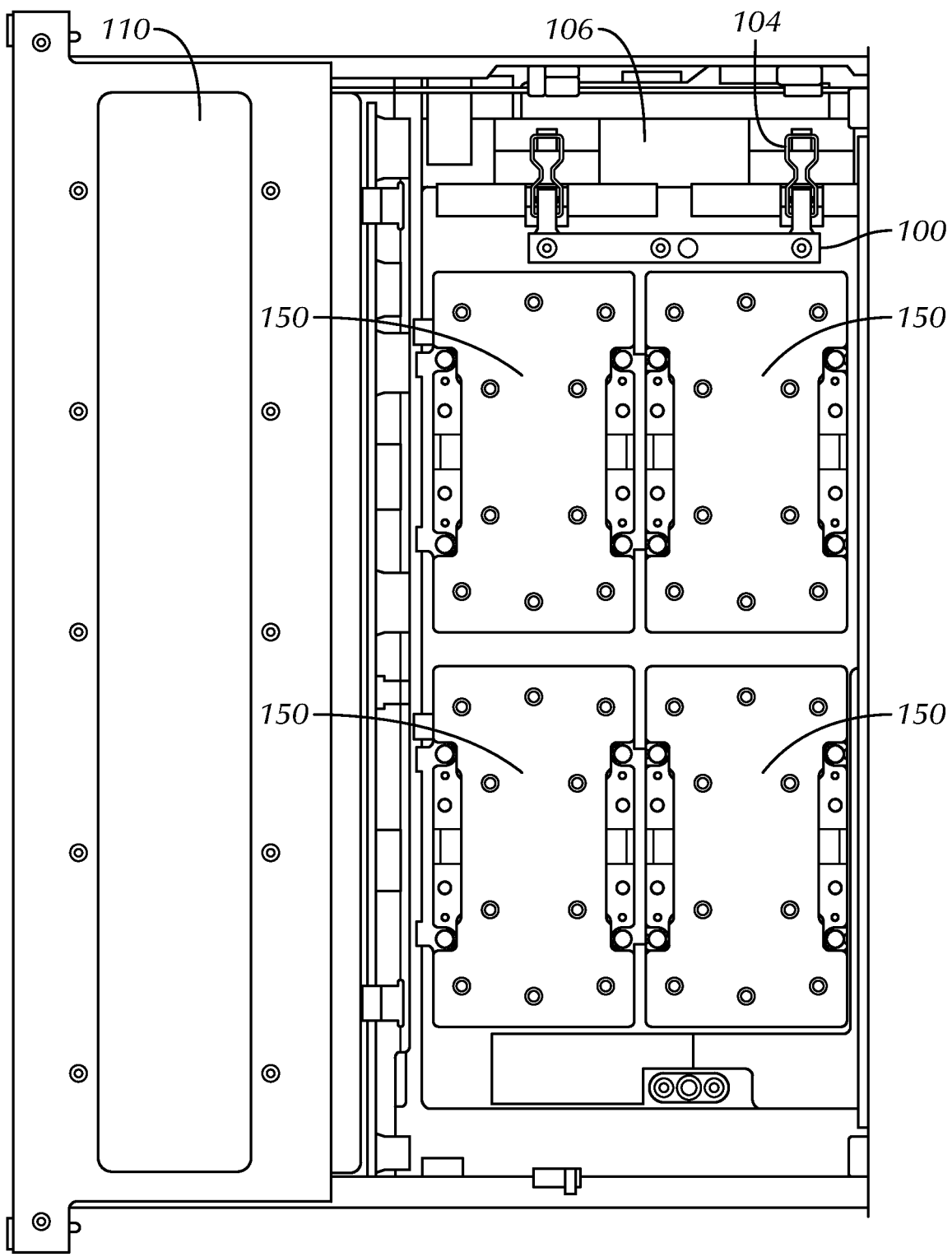
FIG. 1B shows a diagram of a top view of a computing device component in accordance with one or more embodiments described herein.

To further illustrate the layout of the computing device component (10) and the installation mechanism to securely install the computing device component (10) to the computing device (30), see, e.g., FIG. 1B.

While FIG. 1A shows a configuration of components, other configurations may be used without departing from the scope of embodiments described herein. Accordingly, embodiments disclosed herein should not be limited to the configuration of components shown in FIG. 1A.

FIG. 1B shows a diagram of a top view of the computing device component in accordance with one or more embodiments described herein. The computing device component (110) includes the accelerator components (150). The accelerator components (150) illustrated in FIG. 1B may be similar to the accelerator components (20A, 20B) discussed above. The computing device component (110) may further include a base component (100). The base component (100) may be similar to the base component (14) discussed above. The computing device may attach to the computing device component (110) using an attached component (106) of the computing device. The attached component (106) may include any number of ports that may electronically connect the computing device to the computing device component (110). The ports of the attached component (106) may be electronically connected to the computing device. As a non-limiting example, the computing device component (110) may include receiving ports that receive the ports near the base component (100). The receiving ports may be electronically connected to the accelerator components (150) to enable the electronic connection between the ports of the attached components (106) to the accelerator components (150) following an attachment of the computing device component (110) to the attached component (106).

Following the attachment of the computing device component (110) to the attached component (106), the computing device component (110) may further include one or more fastening components (104) that may be used to secure the installation. For additional details regarding the fastening component, see, e.g., FIG. 2.

While FIG. 1B shows a configuration of components, other configurations may be used without departing from the scope of embodiments described herein. Accordingly, embodiments disclosed herein should not be limited to the configuration of components shown in FIG. 1B.

Figure 2:
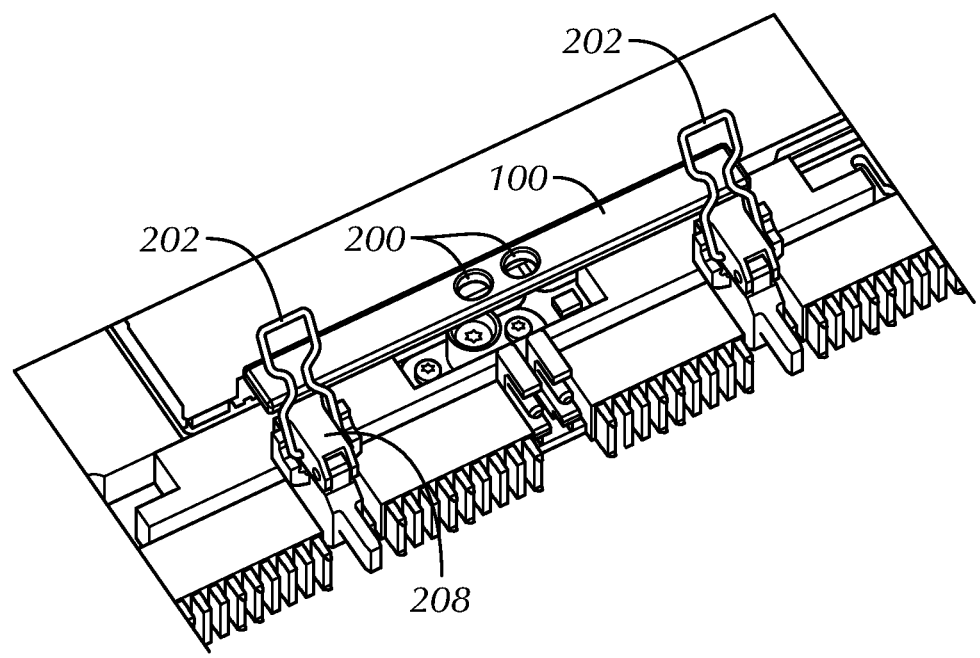
FIG. 2 shows a diagram of a base component in accordance with one or more embodiments described herein.

FIG. 2 shows a diagram of a base component in accordance with one or more embodiments described herein. The base component (100) may include any number of pass through holes (200). FIG. 2 illustrates two pass-through holes. The pass-through holes may be utilized for the installation of the lever body discussed in FIGS. 6A-6B. The base component (100) may be coupled to any number of rotating members (208). FIG. 2 illustrates two rotating members. A rotating member (208) may be adapted to rotate about an axis. The rotation of the axis may enable the securing of an installation of the computing device component discussed above. To enable the securing, the computing device component may include fastening components (202). The fastening components (202) may be a rigid component adapted to rotate about a second axis. The second axis may be parallel to and offset to the axis of the rotating member (208). The offset of the two axis may enable two states of installation (fastened and unfastened states). The fastened and unfastened states may be further discussed in FIGS. 3 and 4. The fastening components (202) may be illustrated in a lifted state in FIG. 2. The fastening components (202) may require being in an unlifted state to install the computing device component to the computing device (not shown). To clarify illustration of the secure installation, see, e.g., FIG. 3.

While FIG. 2 shows a configuration of components, other configurations may be used without departing from the scope of embodiments described herein. Accordingly, embodiments disclosed herein should not be limited to the configuration of components shown in FIG. 2.

Figure 3:
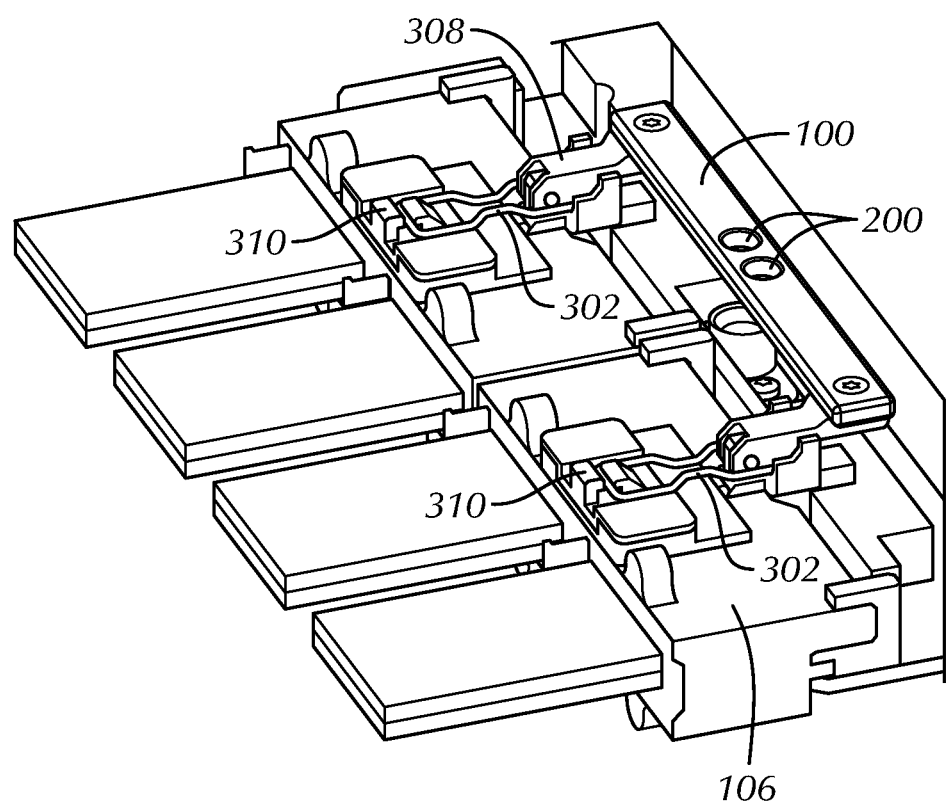
FIG. 3 shows a diagram of a fastened system in accordance with one or more embodiments described herein.

FIG. 3 shows a diagram of a fastened system in accordance with one or more embodiments described herein. The fastened system includes the fastening components (302) in an unlifted state. The fastening components (302) are rotated about its axis to be applied to fasten-receiving portions (310) of the attached component (306).

In the illustration of FIG. 3, the base component is currently in a fastened state. The fastened state may be characterized by the fastening components (302) being secured on the fasten-receiving components (310) and the base component (100) being rotated about the axis of the rotating member (308) to a first position. The first position of the base component (100) describes the position that is most clockwise for the base component rotated about a first axis (e.g., the axis about which the rotating member (308)) in relation to the perspective of FIG. 3. A second position of the base component (100) describes the position that is most counterclockwise rotated about the first axis in relation to the perspective of FIG. 3.

Said another way, a second axis (e.g., the axis about which the fastening component (302) rotates) may rotate about the first axis. The second axis is located on the rotating member (308) between the base component and the first axis. As the rotating member rotates counterclockwise, the base component and the second axis move closer to the fasten-receiving portions (310). Once rotated as much as the components are allowed, the base component (100) may be in a second position. For additional details regarding the first position and the second position, see, e.g., FIGS. 4 and 5.

While FIG. 3 shows a configuration of components, other configurations may be used without departing from the scope of embodiments described herein. Accordingly, embodiments disclosed herein should not be limited to the configuration of components shown in FIG. 3.

Figure 4:
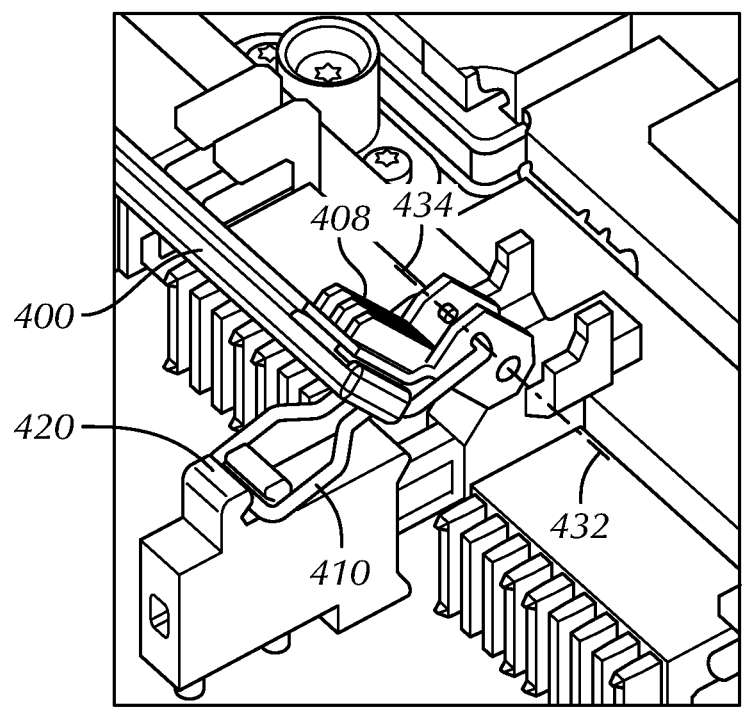
FIG. 4 shows a diagram of a pre-fastened system in accordance with one or more embodiments described herein.

FIG. 4 shows a diagram of a pre-fastened system in accordance with one or more embodiments described herein. For purposes of brevity, only a portion of the system is illustrated in FIG. 4. In one or more embodiments, the base component (400) is illustrated as being in a pre-fastened state (also referred to as an unfastened state or a second position). The unfastened state results in the second axis (434) being closer to the fasten receiving portion (420) than in the first position (seen in FIG. 5). Because of the relative position of the second axis (434), there is no tension applied onto the fastening component (410). As such, the unfastened state of the base component (400) enables a user (e.g., a person) to detach the fastening component (410) from the fasten-receiving portion (420), thus unsecuring the attachment of the computing device (not shown in FIG. 4) from the computing device component. While the attachment is unsecured, the computing device component may be removed (e.g., detached) from the computing device.

Figure 5:
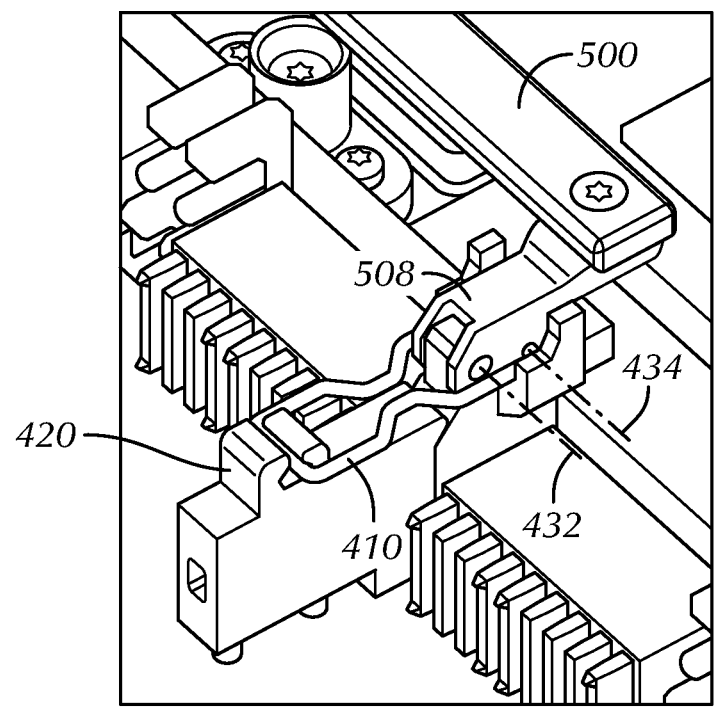
FIG. 5 shows a diagram of a post-fastened system in accordance with one or more embodiments described herein.

To place the base component (400) from the second position to the first position, the rotating member (408) may be rotated about the first axis (432) to the first position. FIG. 5 may illustrate the base component in the first position (also referred to as the fastened state).

While FIG. 4 shows a configuration of components, other configurations may be used without departing from the scope of embodiments described herein. Accordingly, embodiments disclosed herein should not be limited to the configuration of components shown in FIG. 4.

FIG. 5 shows a diagram of a post-fastened system in accordance with one or more embodiments described herein. For purposes of brevity, only a portion of the system is illustrated in FIG. 5. In one or more embodiments, the base component (500) is illustrated as being in a fastened state. The fastened state results in the second axis (434) being farther from the fasten receiving portion (420) than in the second position (seen in FIG. 4). Because of the relative position of the second axis (434), there is applied tension onto the fastening component (410) based on the force from the fasten-receiving portion (420) that enables the fastening components (410) to hold the fasten-receiving portion (420), attached to the computing device (not shown). As such, the fastened state of the base component (400) prevents any undesirable or otherwise unexpected detachment of the computing device component from the computing device, thus securing the attachment of the computing device from the computing device component.

While FIG. 5 shows a configuration of components, other configurations may be used without departing from the scope of embodiments described herein. Accordingly, embodiments disclosed herein should not be limited to the configuration of components shown in FIG. 5.

Any number of reasons may incur difficulty in switching the positions of the base components from a first position to the second position, or from the second position to the first position. Examples of such reasons may include, for example, (i) an intruding component of the computing device component preventing access to the base component by a user, (ii) a high torque required to perform the motion of rotating the base component from one position to another (e.g., due to a small radius on which the user rotates the base component), and (iii) difficulty to find a point in which to apply the force to rotate the base member. Other reasons may incur difficulty to rotate the base component without departing from the invention.

Figure 6A:
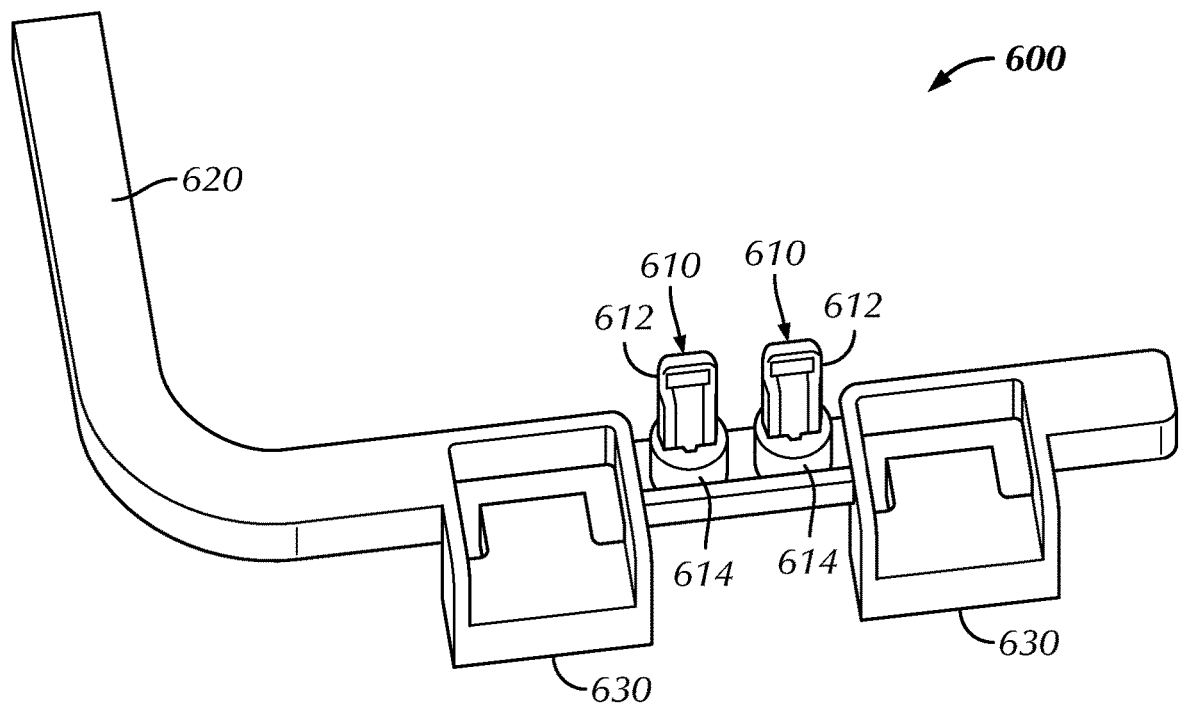
FIG. 6A shows a diagram of a lever body in accordance with one or more embodiments described herein.

To remediate at least the aforementioned reasons embodiments of the invention include introducing a lever body to the base component that provide ease of motion of the base component along the first axis. FIG. 6A shows a diagram of a lever body in accordance with one or more embodiments described herein. The lever body (600) includes a lever extension (620), lever locking components (610), and base-holding portions (630). The lever body (600) may include additional, fewer, and/or different components without departing from the invention.

In one or more embodiments of the invention, the lever extension (620) is a portion of the lever body (600) that protrudes from one end of the lever body (600) such that, when the lever body (600) is attached to a base component (not shown in FIG. 6A), the lever extension (620) extends away from the axis of rotation of the rotating member discussed above. The lever extension (620) may extend further from the extension illustrated in FIG. 6A (see, e.g., FIG. 10).

In one or more embodiments of the invention, the lever locking components (610) include locking actuators (612) and an inserting component (614). The lever locking components (610) may include additional, fewer, and/or different components without departing from the invention.

In one or more embodiments of the invention, the locking actuator (612) is a device that is adapted to be placed in one of two positions: a locked position and an unlocked position. In one or more embodiments of the invention, the locked position refers to a position that results in the lever body being locked to the base component. The actuator being placed in the locked position may reduce detachment from the base component by the lever body (600). In contrast, the unlocked position may be a position that allows the lever body (600) to be removed from the base component. Such position may further be used to enable application of the lever body to the base component. Such application may be described in detail in FIGS. 7A-7B.

In one or more embodiments of the invention, the locking position enables locking of the lever body (600) to the base components by resulting in the insertion of one or more inserting component (614) to the pass-through holes of the base component. In one or more embodiments of the invention, the locking actuator (612) enables such insertion by rotating about an axis (e.g., an axis different from that of the first or second axis discussed above). The rotation results in a force being applied to the inserting components (614) that enable motion of the inserting component (614) away from the locking actuator (612). For a clearer view of the inserting components (614), see, e.g., FIG. 6B.

In one or more embodiments of the invention, the base-holding portions (630) are portions of the lever body (600) adapted to hold the base component during the locking state. The base-holding portions (630) may be designed to prevent movement of the lever body (600) in undesired directions after being placed in a locked position.

While FIG. 6A shows a configuration of components, other configurations may be used without departing from the scope of embodiments described herein. Accordingly, embodiments disclosed herein should not be limited to the configuration of components shown in FIG. 6A.

Figure 6B:
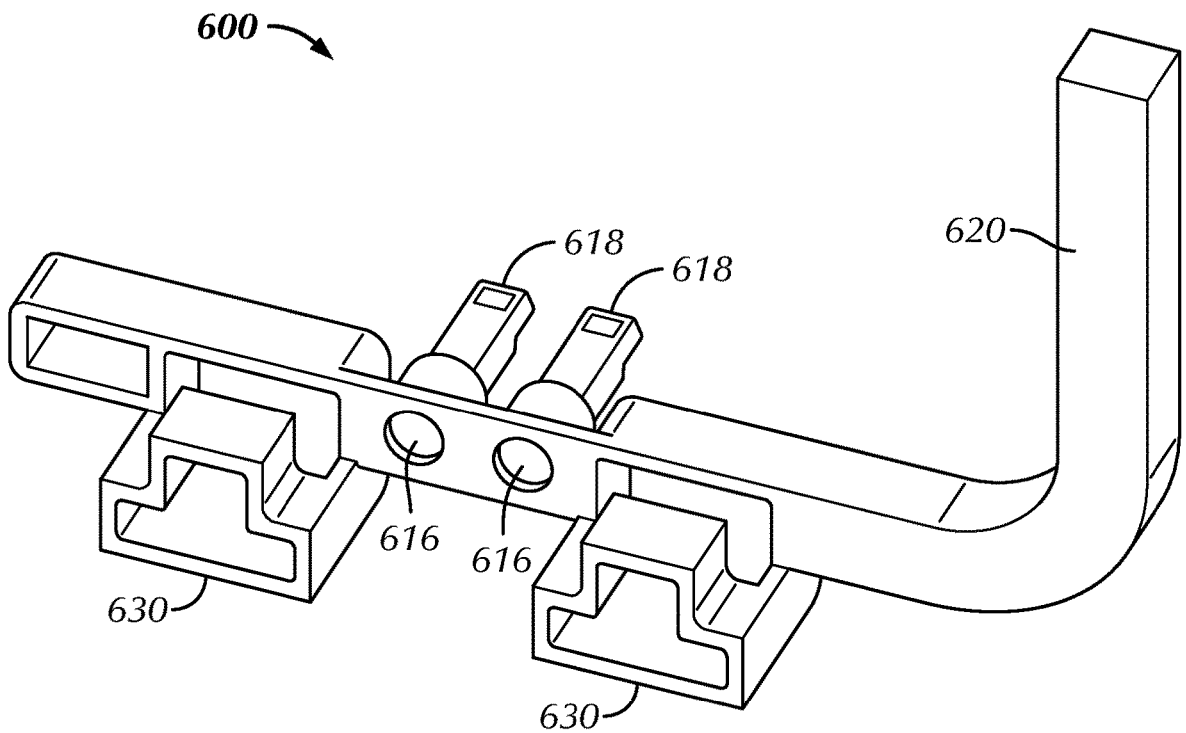
FIG. 6B shows a second diagram of the pre-fastened system in accordance with one or more embodiments described herein.

FIG. 6B shows a second diagram of the pre-fastened system in accordance with one or more embodiments described herein. The second diagram provides a better view of the inserting components (616). The inserting components (616) may extrude along the holes illustrated in FIG. 6B following the locking actuators (618) being placed in a locking position.

Figure 7A:
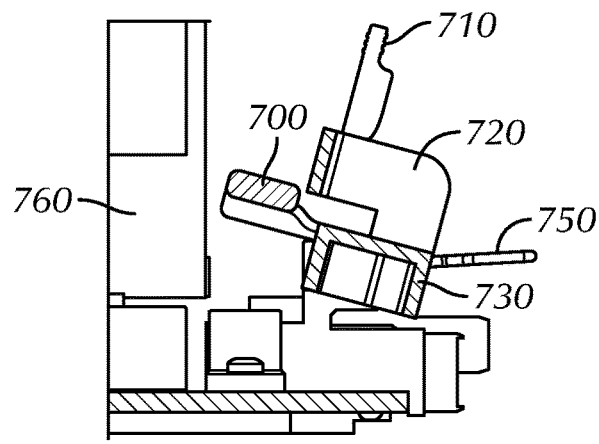
FIG. 7A shows a first diagram of an application of the lever body to the base component in accordance with one or more embodiments described herein.
Figure 7B:
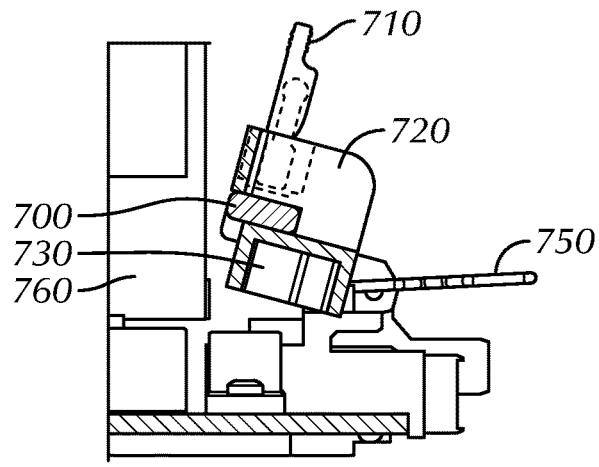
FIG. 7B shows a second diagram of an application of the lever body to the base component in accordance with one or more embodiments described herein.
Figure 7C:
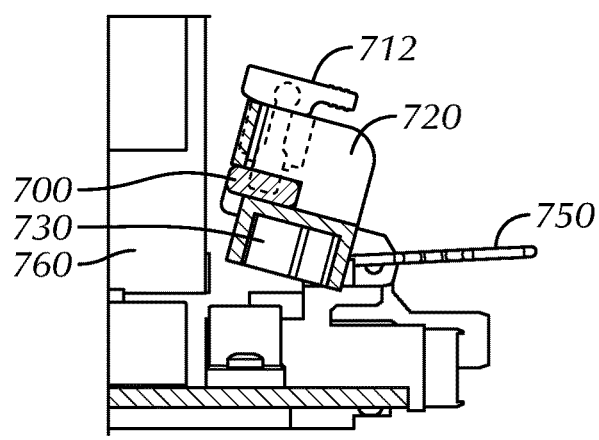
FIG. 7C shows a third diagram of an application of the lever body to the base component in accordance with one or more embodiments described herein.

To clarify the application of the lever body (600) to a base component, FIGS. 7A-7C may be used to visualize the interactions between the lever body (600) and a base component.

While FIG. 6B shows a configuration of components, other configurations may be used without departing from the scope of embodiments described herein. Accordingly, embodiments disclosed herein should not be limited to the configuration of components shown in FIG. 6B.

FIG. 7A shows a first diagram of an application of the lever body to the base component in accordance with one or more embodiments described herein. The diagram may display the components in a side view. As illustrated in FIG. 7A, the accelerator components (760) may be in close proximity to the base component (700). As such, it may be difficult for a user to apply a force to the base component (700) to switch it from a second position (e.g., the unfastened state), to a first position (e.g., a fastened state). In FIG. 7A, the lever body (720) begins to be applied to the base component (700). In this illustration, the base component is in the second position discussed above (e.g., the unfastened state). In this application process, the lever locking portions (710) are in an unlocked state. This may enable the application process to be performed. Continuing with the application process, the lever body (720) may be applied such that the base-holding portions (730) is positioned around the base component (700). To further explain the application process, FIG. 7B shows a diagram of the application process at a later point in time. In the later point in time, the lever body (720) is moved toward the base component (700).

While FIG. 7A shows a configuration of components, other configurations may be used without departing from the scope of embodiments described herein. Accordingly, embodiments disclosed herein should not be limited to the configuration of components shown in FIG. 7A.

FIG. 7B shows a second diagram of an application of the lever body to the base component in accordance with one or more embodiments described herein. The diagram may display the components in a side view. In FIG. 7B, the lever body (720) has been applied to the base component (700). In this illustration, the base component is in the second position discussed above (e.g., the unfastened state). At this point in the application process, the lever locking portions (710) are in an unlocked state. The base-holding portions (730) hold the lever body (720) to the base component (700). Though the base-holding portions (730) may be holding the base component (700) in this position, the lever body (720) is still in a position that enables a user to remove the lever body (720) from the base component (700) with ease. As such, a locking position may be desired to prevent undesired detachment. FIG. 7C shows a diagram at a later point in time after the lever locking portions (710) have been placed in a locked position.

While FIG. 7B shows a configuration of components, other configurations may be used without departing from the scope of embodiments described herein. Accordingly, embodiments disclosed herein should not be limited to the configuration of components shown in FIG. 7B.

FIG. 7C shows a third diagram of an application of the lever body to the base component in accordance with one or more embodiments described herein. The diagram may display the components in a side view. In FIG. 7C, the lever body (720) has been applied to the base component (700), and the locking actuators have been rotated about its axis to place the lever locking portions (712) in a locked position. In this illustration, the base component is in the second position discussed above (e.g., the unfastened state). At this point in time, the base-holding portions (730) continue to hold the lever body (720) to the base component (700). Because of the locked position, it may be difficult to remove the lever body (720) from the base component (700). This may be due to the insertion of inserting components into pass-through holes of the base components (700). The insertion of the inserting components into the pass-through holes is a result of the rotation of the locking actuator about its axis.

While FIG. 7C shows a configuration of components, other configurations may be used without departing from the scope of embodiments described herein. Accordingly, embodiments disclosed herein should not be limited to the configuration of components shown in FIG. 7C.

Figure 8A:
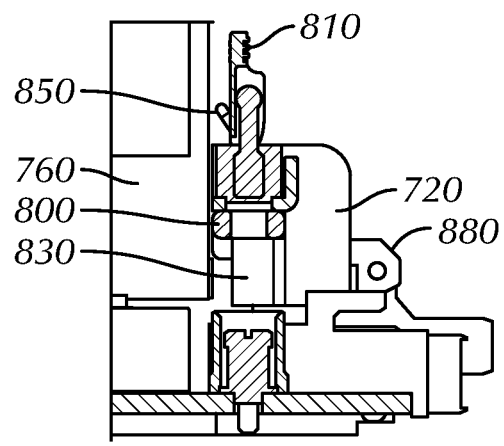
FIG. 8A shows a diagram of the lever body in an unlocked position in accordance with one or more embodiments described herein.
Figure 8B:
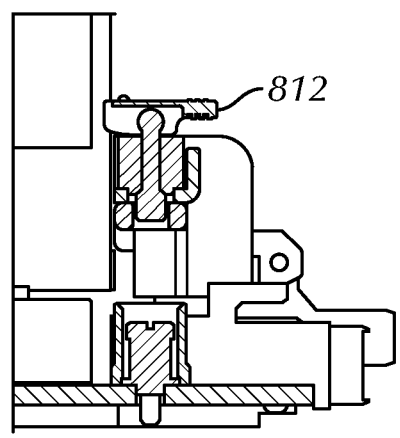
FIG. 8B shows a diagram of the lever body in a locked position in accordance with one or more embodiments described herein.

To further clarify aspects of the invention, FIGS. 8A-8B describe the process of switching the lever locking portions from an unlocked position to a locked position.

FIG. 8A shows a diagram of the lever body in an unlocked position in accordance with one or more embodiments described herein. The diagram may display the components in a side view. In FIG. 8A, the lever body (720) has been applied to the base component (800). In this illustration, the base component (800) is in the first position discussed above (e.g., the fastened state). At this point in the application process, the lever locking portions (810) are in an unlocked state. The base-holding portions (830) hold the lever body (720) to the base component (700). Though the base-holding portions (830) may be holding the base component (800) in this position, the lever body (720) is still in a position that enables a user to remove the lever body (720) from the base component (700) with ease.

While FIG. 8A shows a configuration of components, other configurations may be used without departing from the scope of embodiments described herein. Accordingly, embodiments disclosed herein should not be limited to the configuration of components shown in FIG. 8A.

To switch the lever body (720) from an unlocked state to the locked state, the lever-locking portions (810) may be rotated about its axis. FIG. 8B may display the lever locking portions (810) displaced in a locked position.

FIG. 8B shows a diagram of the lever body in a locked position in accordance with one or more embodiments described herein. The diagram may display the components in a side view. Many components in FIG. 8B have been labeled in FIG. 8A. In FIG. 8B, the lever body (720) has been applied to the base component (700), and the locking actuators have been rotated about its axis to place the lever locking portions (812) in a locked position. In this illustration, the base component is in the first position discussed above (e.g., the fastened state). At this point in time, the base-holding portions (730) continue to hold the lever body (720) to the base component (700). Because of the locked position, it may be difficult to remove the lever body (720) from the base component (700). This may be due to the insertion of inserting components into pass-through holes of the base components (700). The insertion of the inserting components into the pass-through holes is a result of the rotation of the locking actuator about its axis.

While FIG. 8B shows a configuration of components, other configurations may be used without departing from the scope of embodiments described herein. Accordingly, embodiments disclosed herein should not be limited to the configuration of components shown in FIG. 8B.

Figure 9A:
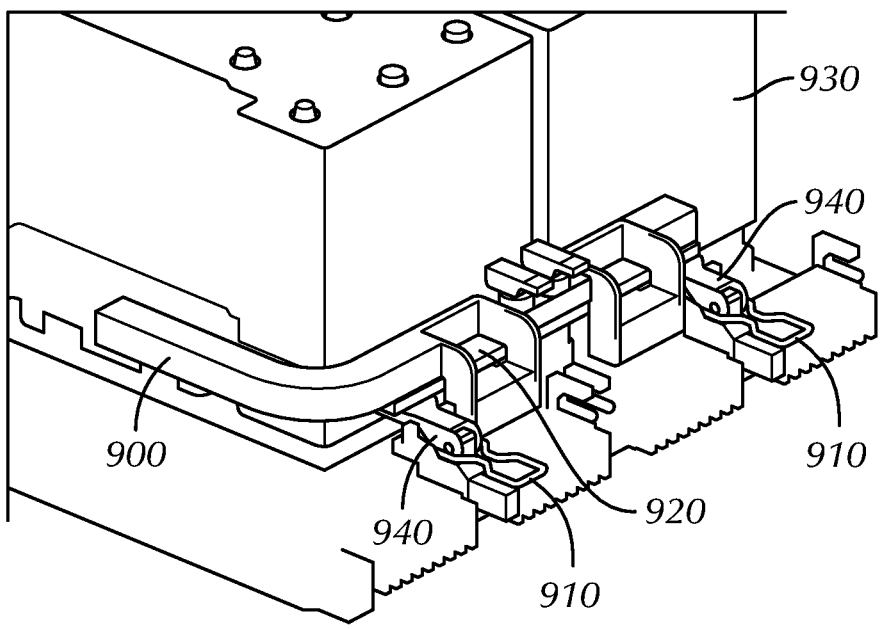
FIG. 9A shows a diagram of a perspective view of the lever body attached to a base component in a fastened state in accordance with one or more embodiments described herein.
Figure 9B:
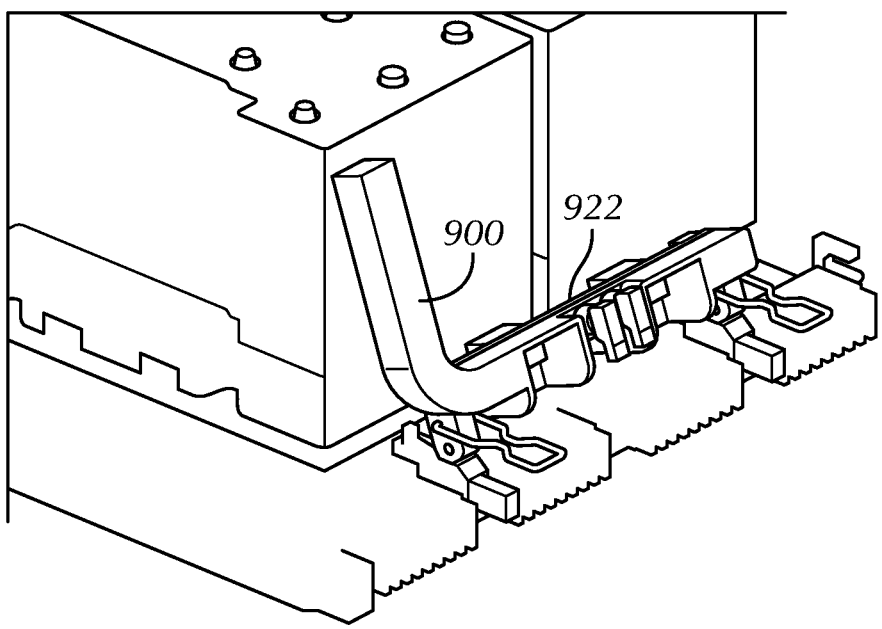
FIG. 9B shows a diagram of a perspective view of the lever body attached to a base component in an unfastened state in accordance with one or more embodiments described herein.

To clarify the motion of the base component about the first axis of the rotating member while the lever body is attached, FIGS. 9A-9B show diagrams of the base component in two positions (the unfastened state and the fastened state).

FIG. 9A shows a diagram of a perspective view of the lever body attached to a base component in a fastened state in accordance with one or more embodiments described herein. At a first point in time, the lever body (900) has been applied to the base component (920). The lever body (900) is in a locked position on the base component (920). Further, the base component (920) is currently in a fastened state. Though not illustrated in FIG. 9A, it may be assumed that in this position, the fastening component (910) may be fastened to an attached component of a computing device. In the fastened state, the computing device component of FIG. 9A may be securely attached to the computing device (not shown).

To unsecure the attachment (e.g., to switch from the first position to the second position) a force may be applied to the lever body about its lever extension to cause the rotating portions (940) to rotate about its axis. The resulting positions of the lever body (900) and the base component (920) may be illustrated in FIG. 9B.

While FIG. 9A shows a configuration of components, other configurations may be used without departing from the scope of embodiments described herein. Accordingly, embodiments disclosed herein should not be limited to the configuration of components shown in FIG. 9A.

FIG. 9B shows a diagram of a perspective view of the lever body attached to a base component in an unfastened in accordance with one or more embodiments described herein. At a second point in time, the lever body (900) is in a locked position, which results in a coupling of the base component (922) and the lever body (900). The lever body (900) and the base component (922) are rotated such that the base component (922) is in the second position (e.g., The unfastened state). While in the second position, an attachment between the computing device component and a computing device (not shown in FIG. 9B) may be performed and/or undone (e.g., resulting in a detachment).

To switch from the second position to the first position (e.g., secure the attachment of the computing device component to the computing device, a force may be applied along the lever extension of the lever body to rotate the base component (922) to the first position. For an illustration of the base component (922) and the lever body (900) in the first position, see, e.g., FIG. 9A.

While FIG. 9B shows a configuration of components, other configurations may be used without departing from the scope of embodiments described herein. Accordingly, embodiments disclosed herein should not be limited to the configuration of components shown in FIG. 9B.

Figure 10:
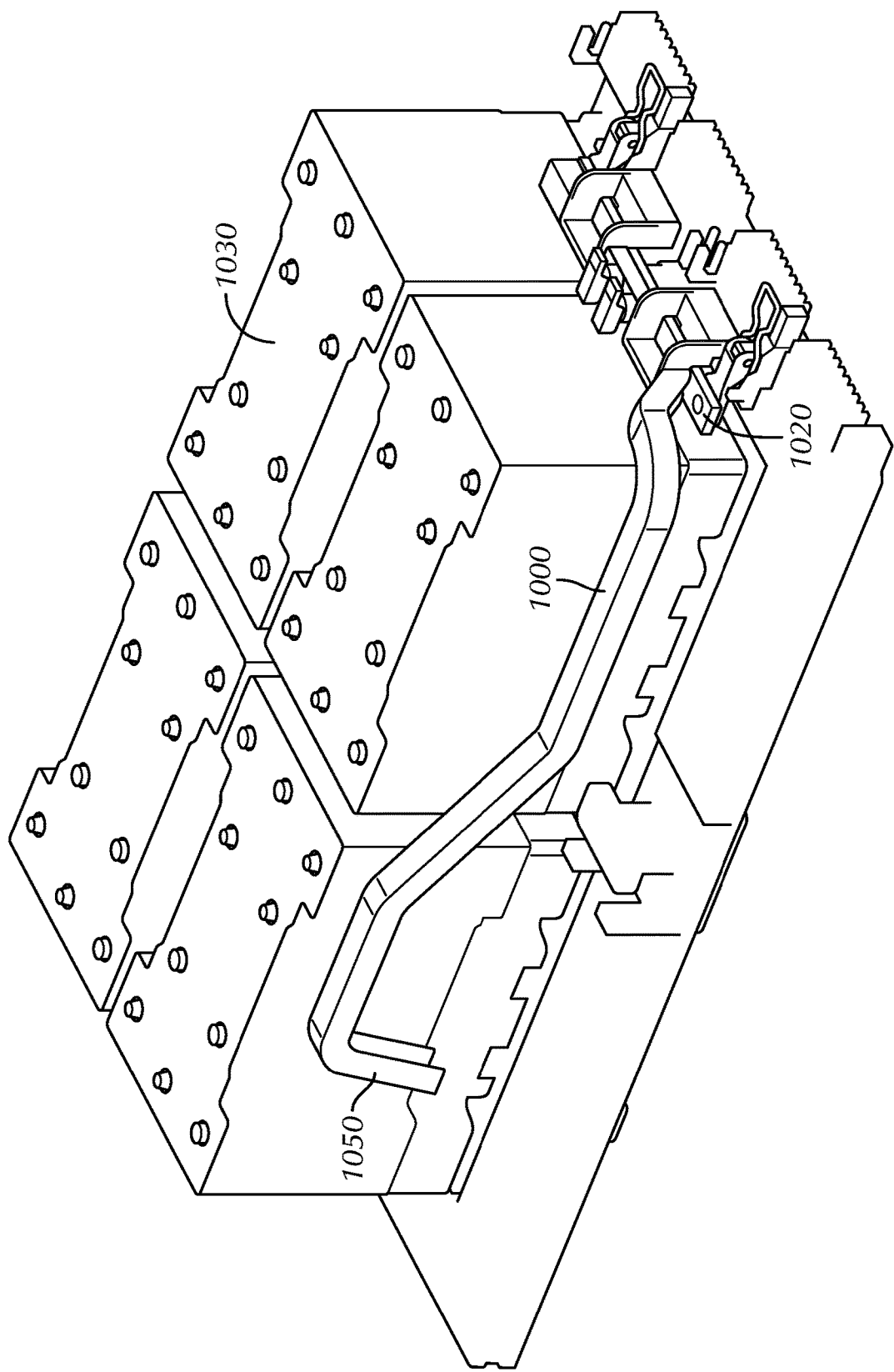
FIG. 10 shows a perspective view diagram of the lever body with a lever extension attached to a base component in a fastened state in accordance with one or more embodiments described herein.

FIG. 10 shows a perspective view diagram of the lever body with a lever extension attached to a base component in a fastened state in accordance with one or more embodiments described herein. The lever body (1000) includes a lever extension (1050), which may extend away from the base component (1020). In FIG. 10, the lever extension (1050) may extend beside the accelerator components (1030) of the computing device component. The lever extension (1050) may be designed such that a human hand may be able to grab a handle of the lever extension (1050) and apply a force along the grabbed portion to cause the base component (1020) to rotate to be placed toward a second position. In FIG. 10, the base component (1020) is in a fastened state. The computing device is not illustrated.

While FIG. 10 shows a configuration of components, other configurations may be used without departing from the scope of embodiments described herein. Accordingly, embodiments disclosed herein should not be limited to the configuration of components shown in FIG. 10.

Figure 11:
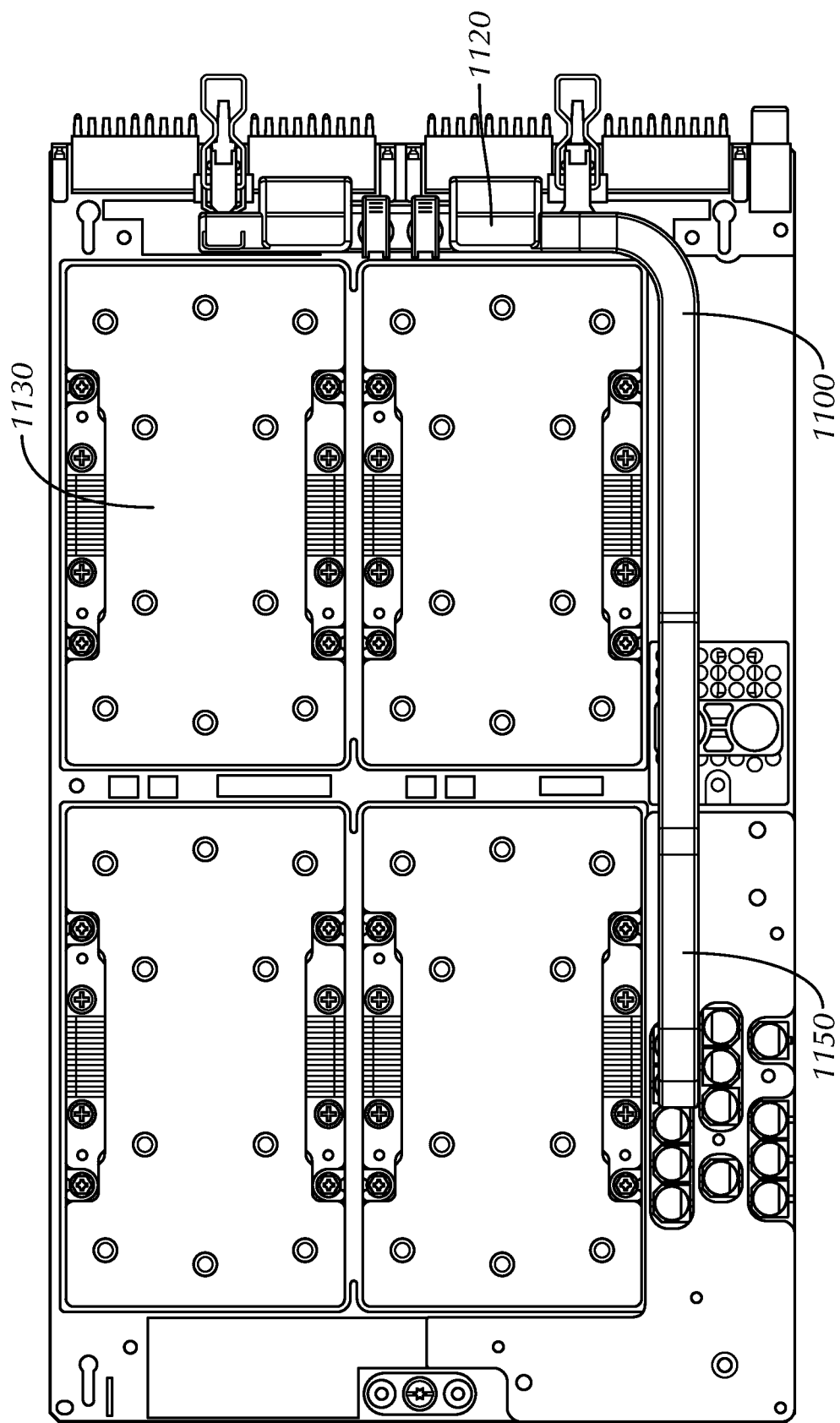
FIG. 11 shows a diagram of a top level view with the lever body attached to a base component in a fastened state in accordance with one or more embodiments described herein.

FIG. 11 shows a diagram of a top level view the lever body attached to a base component in a fastened state in accordance with one or more embodiments described herein. The lever body (1100) includes a lever extension (1150), which may extend away from the base component (1120). In FIG. 11, the lever extension (1050) may extend beside the accelerator components (1130) of the computing device component. In FIG. 11, the base component (1120) is in a fastened state. The computing device is not illustrated.

While FIG. 11 shows a configuration of components, other configurations may be used without departing from the scope of embodiments described herein. Accordingly, embodiments disclosed herein should not be limited to the configuration of components shown in FIG. 11.

Figure 12:
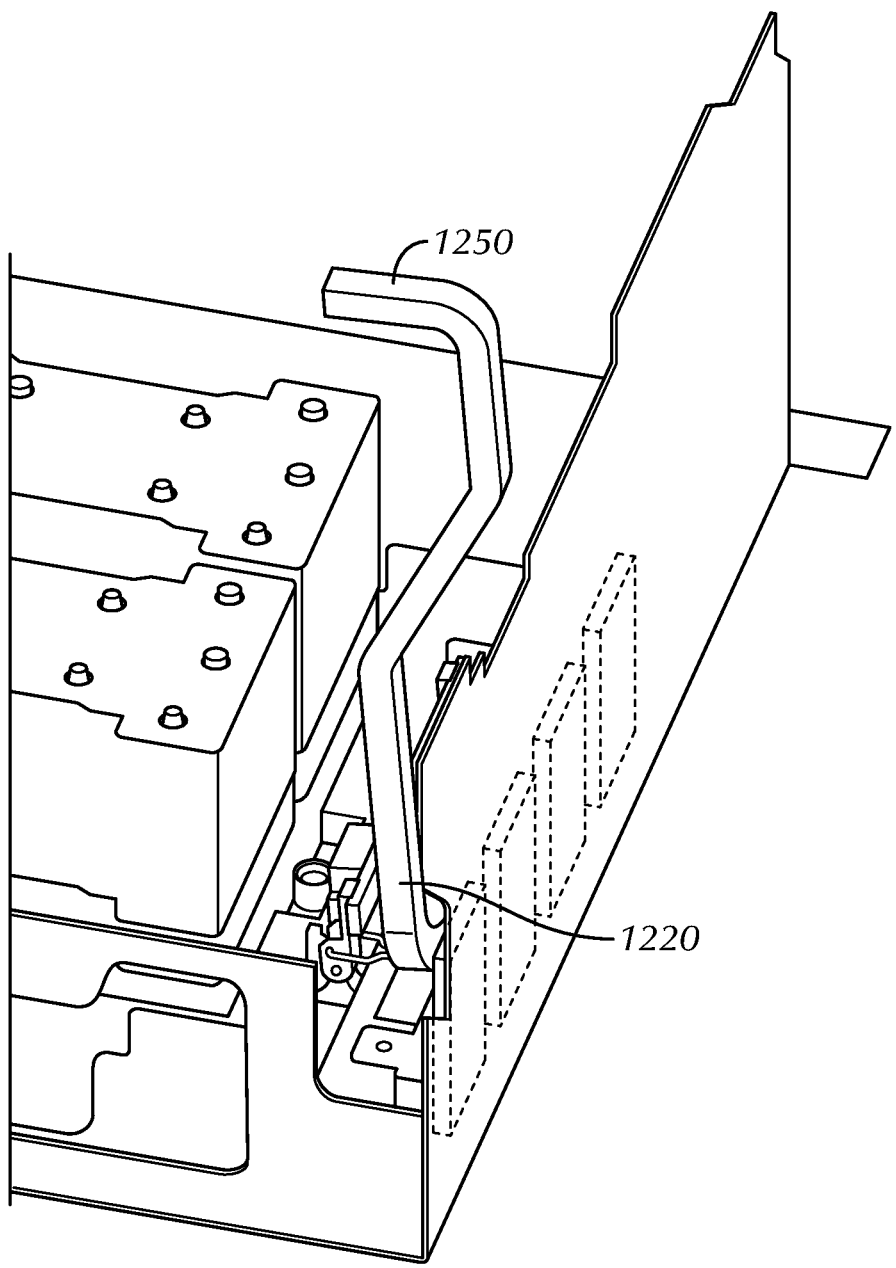
FIG. 12 shows a diagram of a perspective view of the lever body with a lever extension attached to a base component in an unfastened state in accordance with one or more embodiments described herein.

FIG. 12 shows a diagram of a perspective view the lever body with a lever extension attached to a base component in an unfastened state in accordance with one or more embodiments described herein. In FIG. 12, the base component (1220) may be in an unfastened state. The base component (1220) may have been placed in such state by applying a force on the lever extension (1250) that enables rotation of the base component (1220).

While the lever extension has been illustrated as a portion that extends from one end of the base component, embodiments of the invention may include a lever extension that extends away from the base component from two ends and connects at their exterior ends. Such embodiments may be illustrated in FIG. 13.

Figure 13:
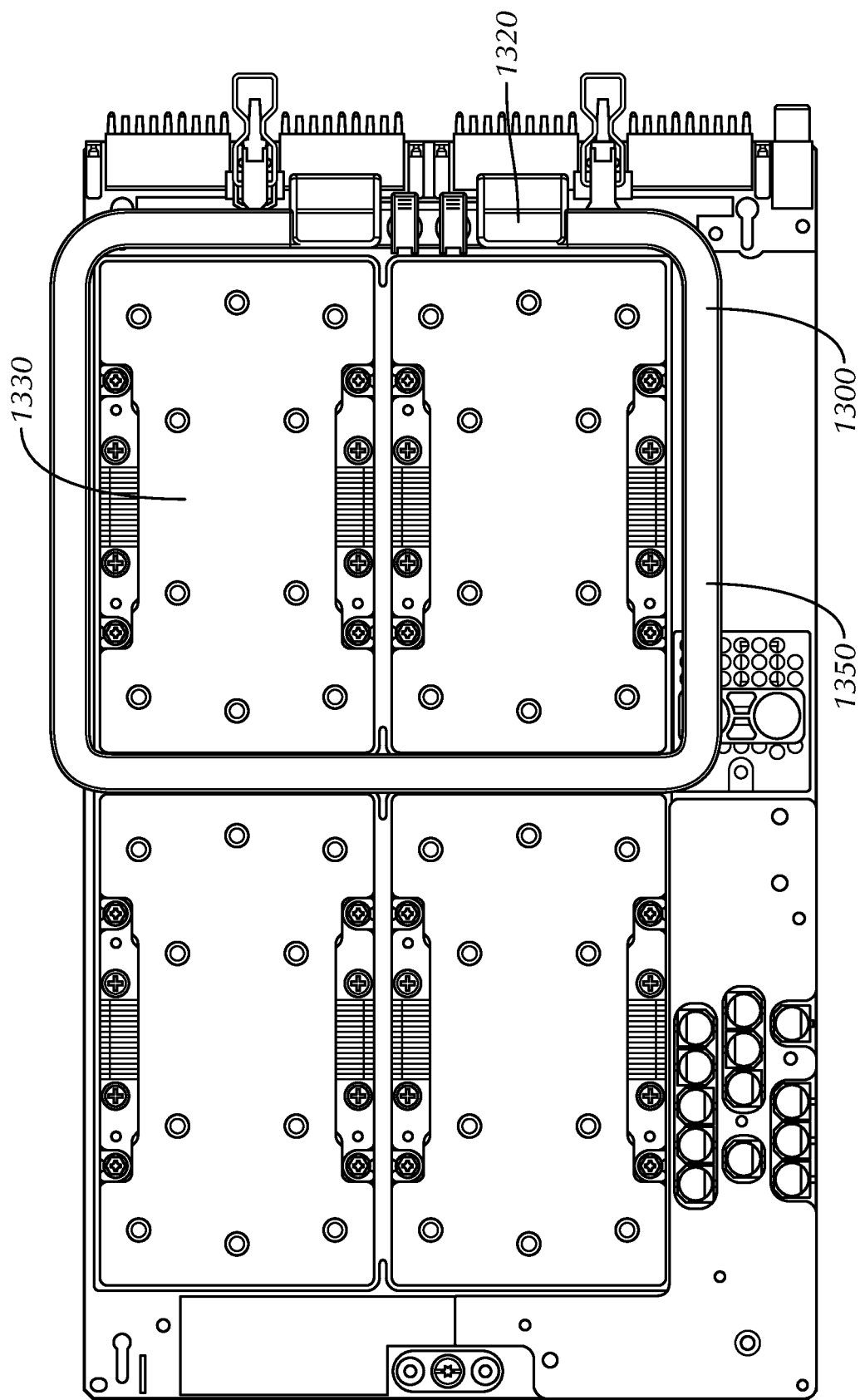
FIG. 13 shows a diagram of a top level view the lever body with a lever ring attached to a base component in a fastened state in accordance with one or more embodiments described herein.

FIG. 13 shows a diagram of a top level view of the lever body with a lever ring attached to a base component in a fastened state in accordance with one or more embodiments described herein. This embodiment may include a lever ring portion (1350). The lever ring extension (1350) may be implemented as two portions that each extend from an end of the lever body (1300). The portions may extend substantially orthogonal to the axis of rotation of the rotating member. In one or more embodiments of the invention, the two portions may be connected by a third portion. The third portion may connect the first two portions from the ends of the two portions that are furthest from the base component (1320). In the embodiment illustrated in FIG. 13, the third portion may extend between spaces of the accelerator components (1330). However, the third portion may be placed in any other portion without departing from the invention. For example, the first portion, second portion, and third portion of the lever ring (1350) may extend around the accelerator components (1330). To rotate the base component (1320) coupled to the lever body (1300), a force may be applied along any portion of the lever ring (1350) to cause such rotation.

While embodiments described herein have been described with respect to a limited number of embodiments, those skilled in the art, having the benefit of this Detailed Description, will appreciate that other embodiments can be devised which do not depart from the scope of embodiments as disclosed herein. Accordingly, the scope of embodiments described herein should be limited only by the attached claims.

What is claimed is:

1. A system for securing a computing device component, the system comprising: the computing device component comprising: a base component comprising a pass through hole; a rotating member coupled to the base component and adapted to rotate about an axis; a lever body comprising: a base-holding portion adapted to be positioned around the base component; and a lever extension at a first end of the lever body and extending substantially orthogonally in a direction substantially orthogonal to the axis, a lever locking component coupled to the lever body and comprising: a locking actuator; in a locked state, an inserting component adapted to insert into the pass-through hole as a result of a rotation of the locking actuator about a second axis different from the axis when the locking actuator is in a locked position; in an unlocked state, the lever body is decoupled from the base component, wherein when a force is applied to the lever extension, the base component rotates about the axis.

2. The system of claim 1, wherein the base component further comprises a second pass through hole, and wherein the lever locking component further comprises a second inserting component adapted to insert into the second pass-through hole when a second locking actuator is in a locked position.

3. The system of claim 1, wherein the computing device further comprises an accelerator component.

4. The system of claim 1, further comprising a fastening component coupled to the rotating member and adapted to fasten the computing device component to the computing device.

5. The system of claim 1, wherein the lever locking component comprises a locking tab, wherein setting the lever locking component into the locked position comprises rotating the locking tab such that the inserting component inserts into the pass-through hole.

6. The system of claim 1, wherein the lever locking portion is configured to detach from the pass-through holes when in an unlocked state.

7. The system of claim 1, further comprising a second base-holding portion, wherein the second base-holding portion is configured to be inserted around the base component.

8. The system of claim 1, wherein when base component are in a first position, the base component is fastened to a computing device.

9. The lever body of claim 5, wherein when the base component are in a second position, the base component is un-fastened from the computing device.

10. The lever body of claim 6, wherein the base component is adapted to move from the first position to the second position when a force is applied to the lever extension to rotate the base component about the axis.

11. The lever body of claim 1, wherein the lever extension extends around a computing component of the computing system and connects to a second end of the lever body.

* * * * *